(12) United States Patent  
Tamai

(10) Patent No.: US 7,804,858 B2  
(45) Date of Patent: Sep. 28, 2010

(54) VEHICLE COMMUNICATION SYSTEM

(75) Inventor: Yasuhiro Tamai, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 838 days.

(21) Appl. No.: 11/242,860

(22) Filed: Oct. 5, 2005

(65) Prior Publication Data

US 2006/0072630 A1   Apr. 6, 2006

(30) Foreign Application Priority Data

Oct. 6, 2004   (JP)   ............................. 2004-293928

(51) Int. Cl.  
*H04J 3/06* (2006.01)

(52) U.S. Cl. .................. 370/517; 370/464; 370/465; 370/466; 370/535; 326/30; 327/261; 455/99; 455/127.1; 455/151.4; 455/152.1; 340/428; 340/430; 340/426.16; 340/426.17; 340/426.23; 340/426.27; 340/426.28; 340/426.29; 340/426.3; 340/426.31; 340/426.32; 340/426.33; 340/426.34

(58) Field of Classification Search .................. 370/517; 326/30; 327/261; 455/99, 127.1, 151.4, 455/152.1; 340/428, 430, 426.16, 426.17, 340/426.23, 426.27, 426.28, 426.29, 426.3, 340/426.31, 426.32, 426.33, 426.34  
See application file for complete search history.

(56) References Cited

U.S. PATENT DOCUMENTS

| | | | | |
|---|---|---|---|---|
| 3,670,182 A | * | 6/1972 | Konno et al. ................. | 327/263 |
| 4,160,276 A | * | 7/1979 | Baker .......................... | 348/625 |
| 4,218,763 A | * | 8/1980 | Kelley et al. ................. | 340/429 |
| 4,677,462 A | * | 6/1987 | Bell ............................. | 348/712 |
| 5,014,286 A | * | 5/1991 | Ransijn ....................... | 375/360 |
| 5,523,704 A | * | 6/1996 | So ............................... | 326/30 |
| 6,151,298 A | * | 11/2000 | Bernhardsson et al. ...... | 370/225 |
| 7,349,479 B2 | * | 3/2008 | Suganuma et al. .......... | 375/257 |
| 7,362,214 B2 | * | 4/2008 | Mizutani ............... | 340/310.11 |
| 2003/0001610 A1 | | 1/2003 | Ramachandran et al. | |
| 2003/0128047 A1 | * | 7/2003 | Humphrey ................... | 326/30 |
| 2003/0190849 A1 | | 10/2003 | Deas et al. | |
| 2004/0008079 A1 | * | 1/2004 | Osamura et al. ............ | 327/540 |
| 2007/0018683 A1 | * | 1/2007 | Takekuma et al. ............ | 326/30 |
| 2009/0015289 A1 | * | 1/2009 | Takekuma et al. ............ | 326/30 |

FOREIGN PATENT DOCUMENTS

JP   2000-151153   5/2000

* cited by examiner

*Primary Examiner*—Aung S Moe  
*Assistant Examiner*—Christopher P Grey  
(74) *Attorney, Agent, or Firm*—Finnegan, Henderson, Farabow, Garrett & Dunner LLP

(57) ABSTRACT

A transmission ECU on a transmission side and reception ECUs on a reception side are connected through communication lines and junction connectors. A delay circuit is provided in each of the junction connectors on the side of the reception ECUs. One end of the delay circuit is connected to the communication line on the side of the transmission ECU and the other end of the same is connected to the communication line on the side of the reception ECU. The communication lines on the both ends of the delay circuit are grounded through termination resistors.

5 Claims, 8 Drawing Sheets

VEHICLE COMMUNICATION SYSTEM

BACKGROUND OF THE INVENTION

1. Field of the Invention

The present invention relates to a vehicle communication system for performing data communication between ECUs mounted on a vehicle.

2. Description of the Related Art

Along with a recent increase in electronic instrumentation mounted on a vehicle, a number of ECUs (electronic control units) have been provided in a vehicle. Further, in order for ECUs to perform data communication to each other, communication lines for data transmission are cabled between ECUs, and junction connectors (hereinafter, referred to as "J/Cs") for branching the communication lines are provided.

FIG. 1 is an explanatory view showing a construction of a conventional vehicle communication system. As shown in the drawing, in the vehicle communication system, a J/C 103 is connected to an ECU 101 serving as a starting point, and a communication line branches in two lines through a J/C 103. The branch lines are connected to J/C 104 and J/C 105, respectively.

Six ECUs 102 are connected to the J/C 104 and J/C 105, respectively, and the junction points within the J/C 104 and J/C 105 are grounded through termination resistors $R_T$, respectively.

Further, the length of the communication line connecting the ECU 101 serving as a starting point and the J/C 103 is set at 4 m, and the lengths of the communication lines connecting the J/C 103 and the J/C 104, and the J/C 103 and the J/C 105 are both set at 4.5 m. Lengths of the communication lines between the J/C 104 and each ECU 102, and between the J/C 105 and each ECU 102 are set at 2 m. In the drawing, Tx represents transmission and Rx represents reception.

In the vehicle communication system with the above construction, once a signal is transmitted from the ECU 101 as the starting point to each ECU 102 when an ON state (dominant) is turned into an OFF state (recessive) so-called ringing in which a signal waveform largely oscillates in the vertical direction sometimes occurs.

FIGS. 2 and 3 are characteristic views showing signal waveforms at different parts of the vehicle communication system when a signal is transmitted from the ECU 101. In FIG. 2, a curve S101 represents a voltage generated at the output terminal of the ECU 101, and a curve S102 represents a voltage generated at the J/C 104. A curve S103 shown in FIG. 3 represents a voltage generated at the input terminal of the ECU 102.

In FIGS. 2 and 3, an output of a transmission signal is switched from the OFF state to the ON state at time t101. Such an output signal from the ECU 101 then reaches a predetermined voltage level and a desired signal is transmitted to the other ECU 102.

At time t102, the ON state of an output of a transmission signal is switched to the OFF state. The output of a transmission signal is then turned off, but the waveform S101 at the output terminal of the ECU 101 shows large vertical oscillations due to ringing, and it continues to oscillate until time t103, the next turn-on time.

Therefore, as shown in the curve S102 in FIG. 2 and the curve S103 in FIG. 3, voltages generated at the J/C 104 and the input terminals of the ECUs 102 on the reception side, continue to have waveforms vertically oscillating with small amplitudes. This is attributed to the fact that the junction points within the J/C 104 become "sections" of a standing wave generated between the ECU 101 and the J/C 104. Once such ringing occurs, an error occurs in a communication signal between the ECU 101 and the ECUs 102, causing a problem of degraded communication accuracy.

Furthermore, since ringing occurs because of the junction points within the J/C 104 becoming "sections" of a standing wave as stated above, ringing is not something that always occurs. Characteristic impedance changes depending on various conditions including the length of communication lines between ECUs and J/Cs, the size of the termination resistors $R_T$ connected to the J/C 104 and J/C 105, the number of ECUs 102 connected to the J/C 104 and J/C 105. A large scale of ringing or no ringing may occur depending on the magnitude of the characteristic impedance.

Therefore, it is possible to prevent ringing by determining positions of the ECUs 101 and 102 and the J/Cs 103 to 105, lengths of communication lines and the like in the vehicle based upon rough prediction of conditions with which no ringing may occur. Nevertheless, in reality, characteristic impedance may change due to variation in lengths of communication lines in different vehicles on which the ECUs, J/Cs, and the communication lines are mounted, and addition of ECUs, which may result in ringing.

A proposed method for preventing ringing without fail is disclosed, for example, in Japanese Patent Laid-Open Publication No. 2000-151153. In this method, drivers are connected to respective bus lines to drive the bus lines. Thus, characteristic impedance is prevented from changing.

SUMMARY OF THE INVENTION

However, with the above system described in Patent Document, a driver has to be incorporated in each bus line. Therefore, the size of the entire system becomes large, resulting in a problem of a cost increase.

The present invention has accomplished to solve the above conventional problem. It is an object of the present invention to provide a vehicle communication system capable of preventing an occurrence of ringing with a simple construction.

In order to achieve the abovementioned object, an aspect of the present invention is a vehicle communication system characterized by comprising a transmission node, a plurality of reception nodes connected to the transmission node through communication lines and branching means for branching the communication line into a plurality of lines, a delay circuit provided in the branching means, and having one end connected to the communication line on a side of the transmission node and the other end connected to the communication line on a side of the plurality of reception nodes, a first termination resistor which grounds one end of the delay circuit, and a second termination resistor which grounds the other end of the delay circuit.

According to the aspect of the present invention, the branching means is provided with the delay circuit, one end of the delay circuit is grounded through the first termination resistor and the other end of the delay circuit is grounded through the second termination resistor. This prevents the branching means from becoming a "section" causing generation of a standing wave in the communication lines connecting the branching means and the transmission node. Therefore, generation of ringing is prevented.

Values of resistance of the first and second termination resistors may be the same.

With the above-described construction, since the values of resistance of the first and second termination resistors are the same, it becomes easy to set values of resistance and arrangement of the termination resistors into the entire circuit.

The delay circuit may include at least one of a resistor, a coil, or a capacitor.

With the above-described construction, since a resistor, a coil or a capacitor is used as an element constructing the delay circuit, the delay circuit can be constructed with a simple element. This contributes to miniaturizations of the system and realization of a space-saving structure. Moreover, the system can be made at low cost.

The delay circuit may be an electric wire having a predetermined length.

With the above-described construction, since the delay circuit is constructed using an electric wire such as a wire harness, connection of the delay circuit can be carried out easily and work of attaching the delay circuit is thus simplified.

DESCRIPTION OF THE PREFERRED EMBODIMENTS

Figure 1:
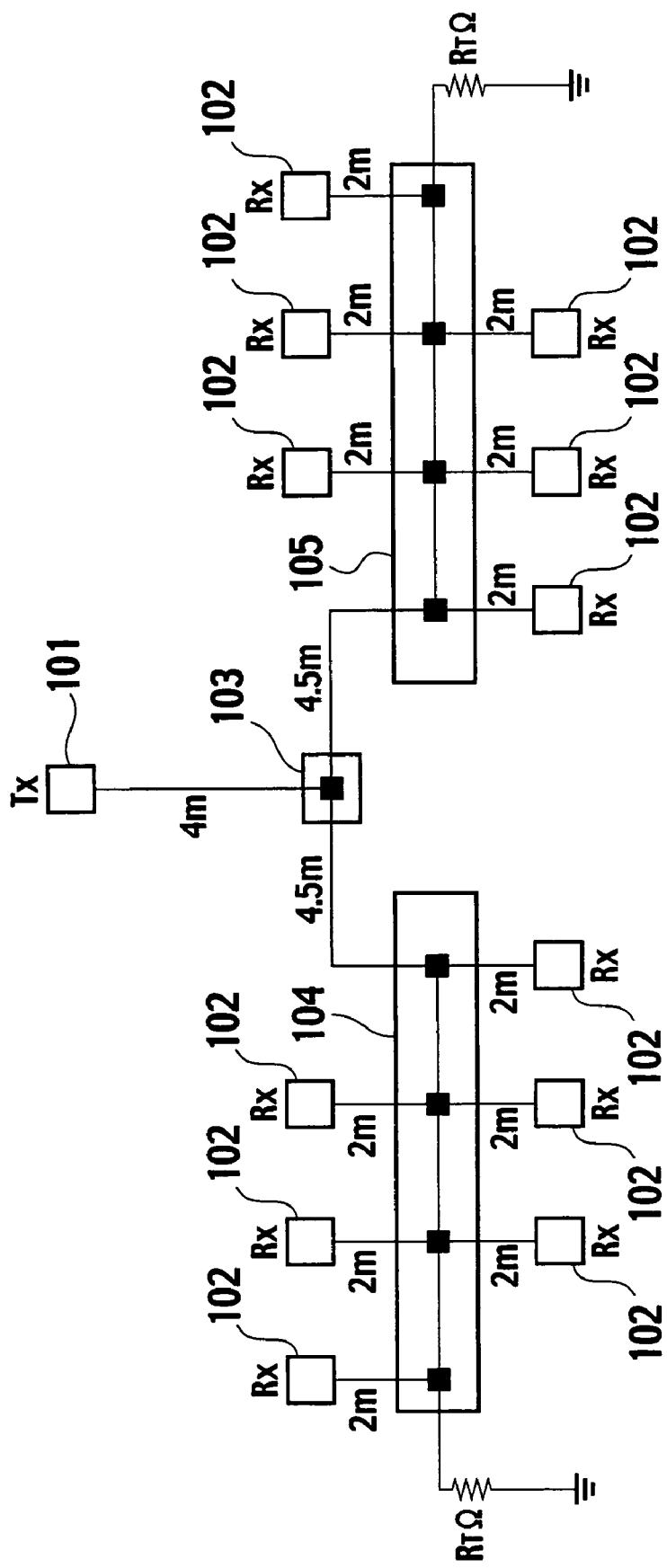
FIG. 1 is a circuit diagram showing a construction of a conventional vehicle communication system.

An embodiment of the present invention is described below with reference to the drawings. In the drawings, the same and similar parts are designated by the same or similar reference numerals.

Moreover, the embodiment to be described below show, as examples, an system and a method for embodying a technical idea of this invention. The technical idea of this invention does not limit materials, shapes, structures, arrangements, and the like of constituent parts to ones to be described below. Various alterations can be added to the technical idea of this invention within the range of the scope of claims.

Figure 4:
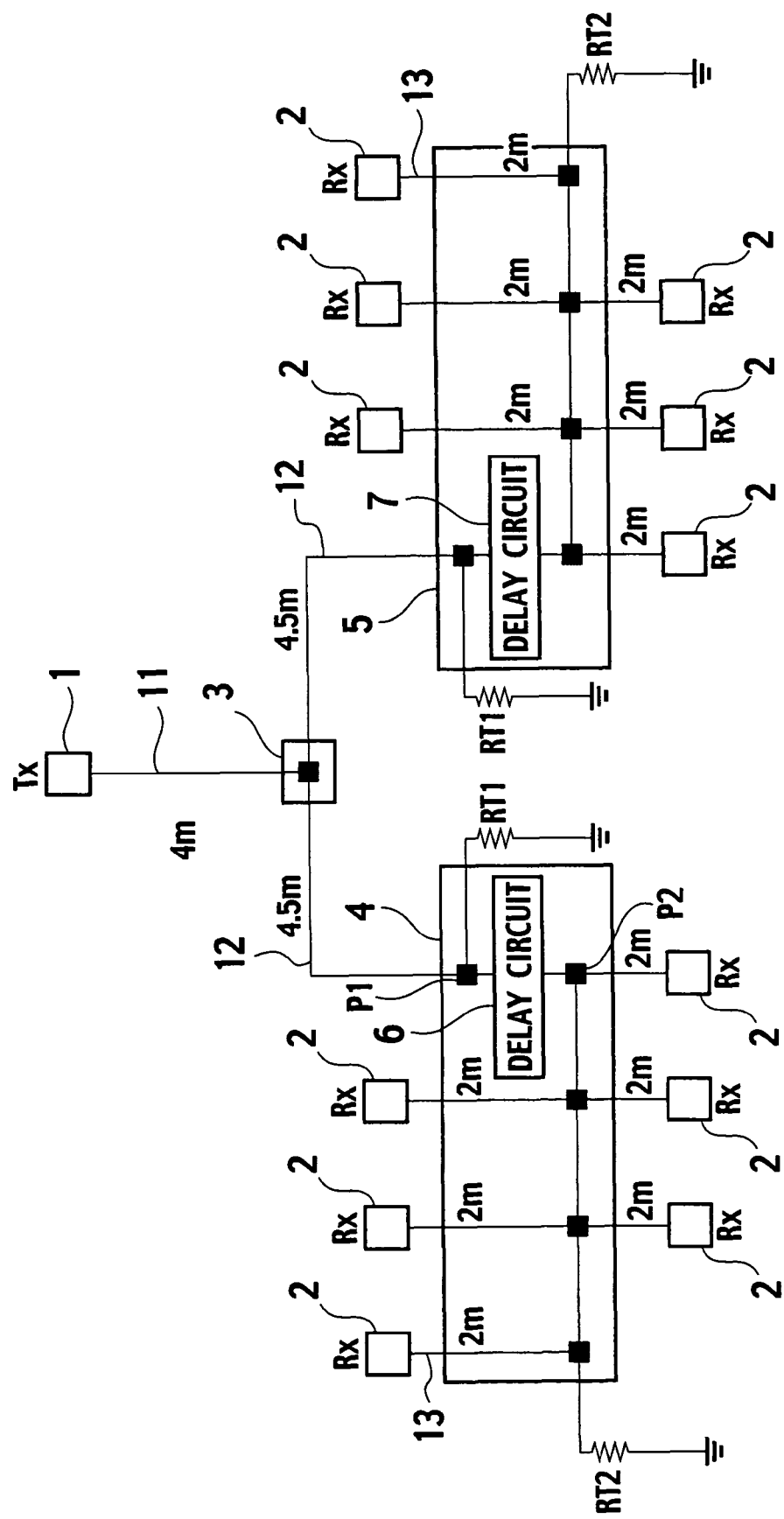
FIG. 4 is a circuit diagram showing a construction of a vehicle communication system according to an embodiment of the present invention.

FIG. 4 is an explanatory view showing a construction of a vehicle communication system according to an embodiment of the present invention. As shown in the drawing, the vehicle communication system conducts data communication between an ECU (a transmission node) 1 serving as a starting point and other ECUs (reception nodes) 2. The ECU 1 is connected to a junction connector (hereinafter, referred to as a "J/C") 3 through a communication line 11. Further, the J/C 3 branches a communication line into two lines and the lines are connected to J/Cs (branching means) 4 and 5 through communication lines 12, respectively. In the drawing, Tx represents transmission and Rx represents reception.

The ECU 1 may be, for example, a meter ECU mounted on a vehicle. The ECUs 2 may be, for example, a door ECU, a sensor ECU, a steering ECU, a wiper ECU, a yaw rate ECU, and the like.

The J/C 4 has a delay circuit 6. One end of the delay circuit 6 (set as a point P1) is connected to the communication line 12 and also grounded through a termination resistor $R_T1$ (a first termination resistor). The other end of the delay circuit 6 (set as a point P2) branches into six lines, which are then connected to six ECUs 2 through a communication line 13, respectively. The point P2 is also grounded through a termination resistor $R_T2$ (a second termination resistor).

Similarly, the J/C 5 has a delay circuit 7. One end of the delay circuit 7 is connected to the communication line 12 and also grounded through a termination resistor $R_T1$ (a first termination resistor). The other end of the delay circuit 7 branches into six lines, which are then connected to six ECUs 2 through communication line 13, respectively. This junction point is also grounded through a termination resistor $R_T2$ (a second termination resistor). Note that each of the two termination resistors $R_T1$ and $R_T2$ has a value of resistance twice as large as that of the termination resistor $R_T$ shown in FIG. 1 in the conventional example. Therefore, a value of parallel combined resistance of the two termination resistors $R_T1$ and $R_T2$ becomes equal to that of the termination resistor $R_T$.

Moreover, the length of communication line 11 connecting the ECU 1 as the starting point and the J/C 3 is set at 4 m, and those of communication lines 12 connecting the J/C 3 and the J/C 4, and the J/C 3 and the J/C 5 are set at 4.5 m, respectively. Also, the lengths of the communication lines 13 connecting the J/C 4 and each ECU 2, and J/C 5 and each ECU 2 are set at 2 m, respectively. Moreover, the delay circuits 6 and 7 are configured by elements such as resistors, coils and capacitors so that the circuits have equal impedance to that of a 0.6 m-long communication line.

Next, effects of the vehicle communication system according to this embodiment with above-mentioned construction are described. Once a transmission signal is outputted from the ECU 1, the output signal is transmitted to each ECU 2 through the communication line 11, the J/C 3, the communication lines 12, the J/Cs 4 and 5 and the communication lines 13.

Figure 5:
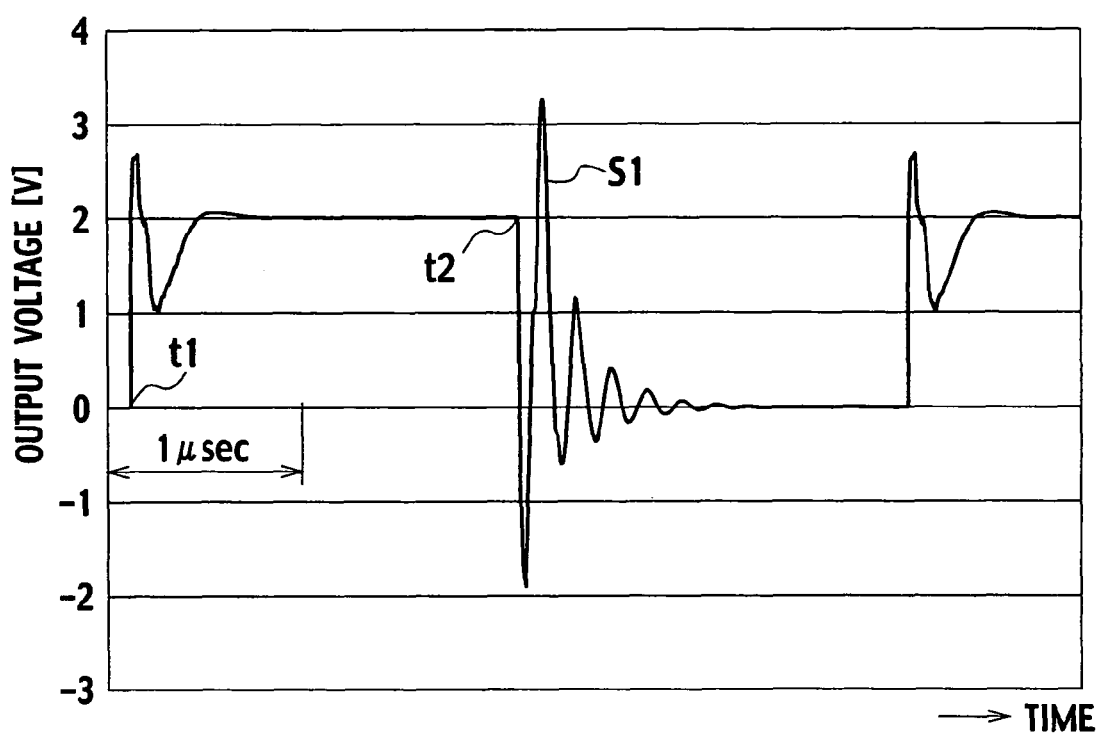
FIG. 5 is a characteristic view showing a waveform of a voltage generated at an output terminal of ECU 1 shown in FIG. 4.
Figure 6:
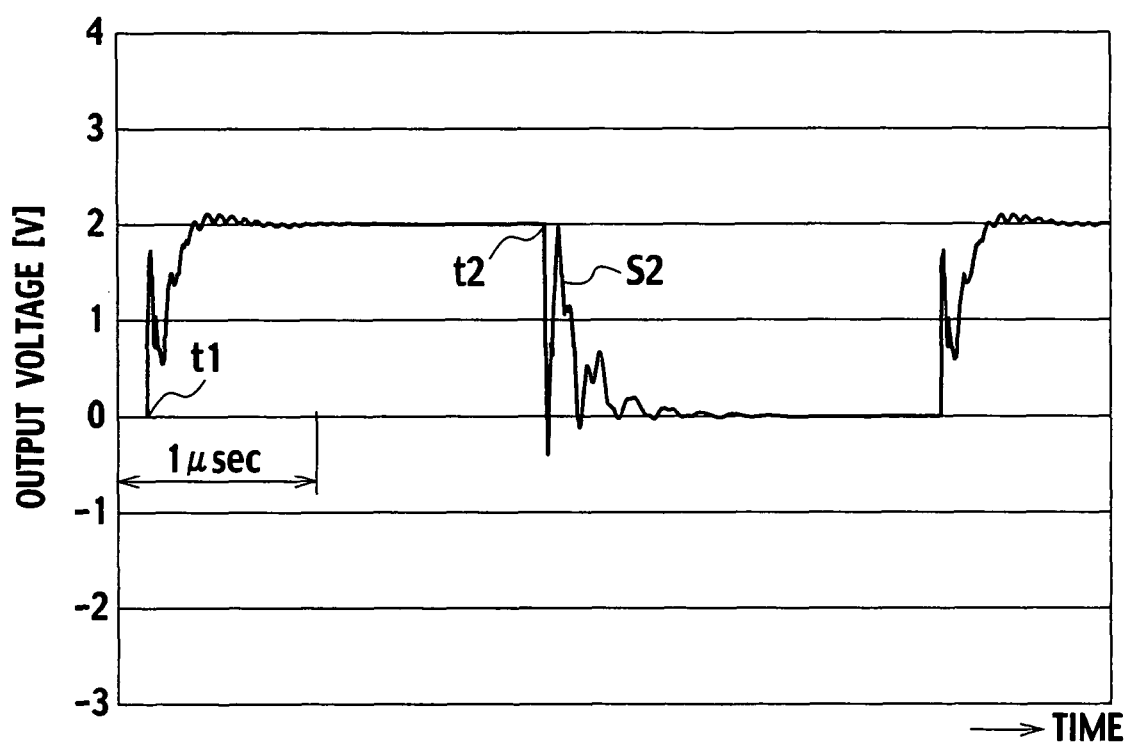
FIG. 6 is a characteristic view showing a waveform of a voltage generated at a point P1 shown in FIG. 4.
Figure 7:
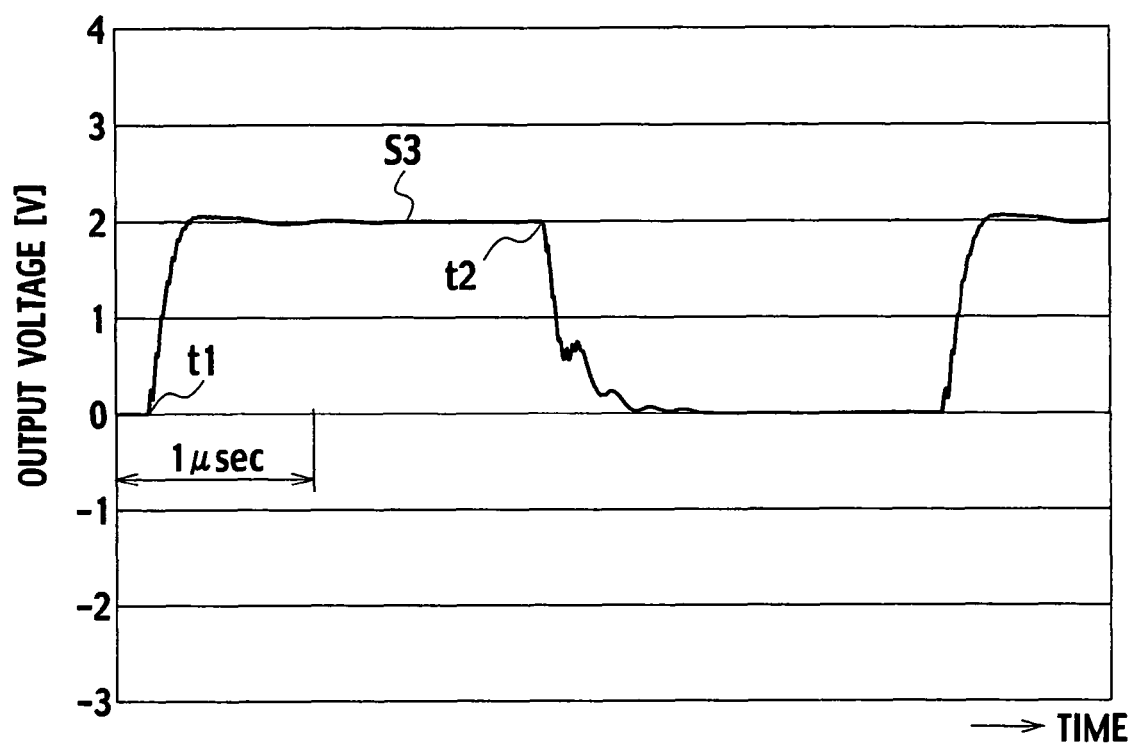
FIG. 7 is a characteristic view showing a waveform of a voltage generated at a point P2 shown in FIG. 4.
Figure 8:
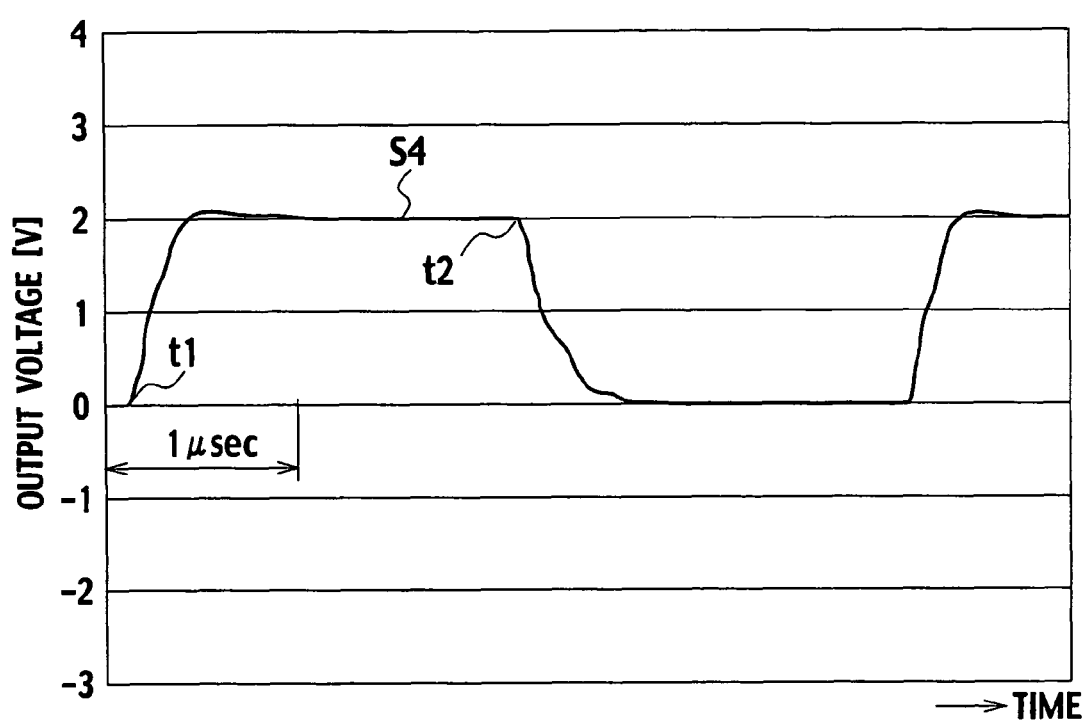
FIG. 8 is a characteristic view showing a waveform of a voltage generated at an input terminal of ECU 2 shown in FIG. 4.

A curve S1 shown in FIG. 5 represents a signal waveform generated in the communication line 11 when a transmission signal is outputted from the ECU 1. A curve S2 shown in FIG. 6 represents a signal waveform at the junction point P1 of the delay circuit 6 and the communication line 12. A curve S3 shown in FIG. 7 represents a signal waveform at the junction point P2 of the delay circuit 6 and the communication line 13. A curve S4 shown in FIG. 8 represents a signal waveform generated at an input terminal of the ECU 2. For each signal waveform, the horizontal axis represents time and the longitudinal axis represents a voltage level.

Once transmission of a signal from the ECU 1 is turned on from an OFF state at time t1 in FIG. 5, the ECU 1 starts transmission of a signal. Thereafter, once the transmission is turned off at time t2, the signal waveform shows a large oscillation to the negative direction and another large oscillation in the positive direction, and is suddenly reduced to zero voltage.

Figure 2:
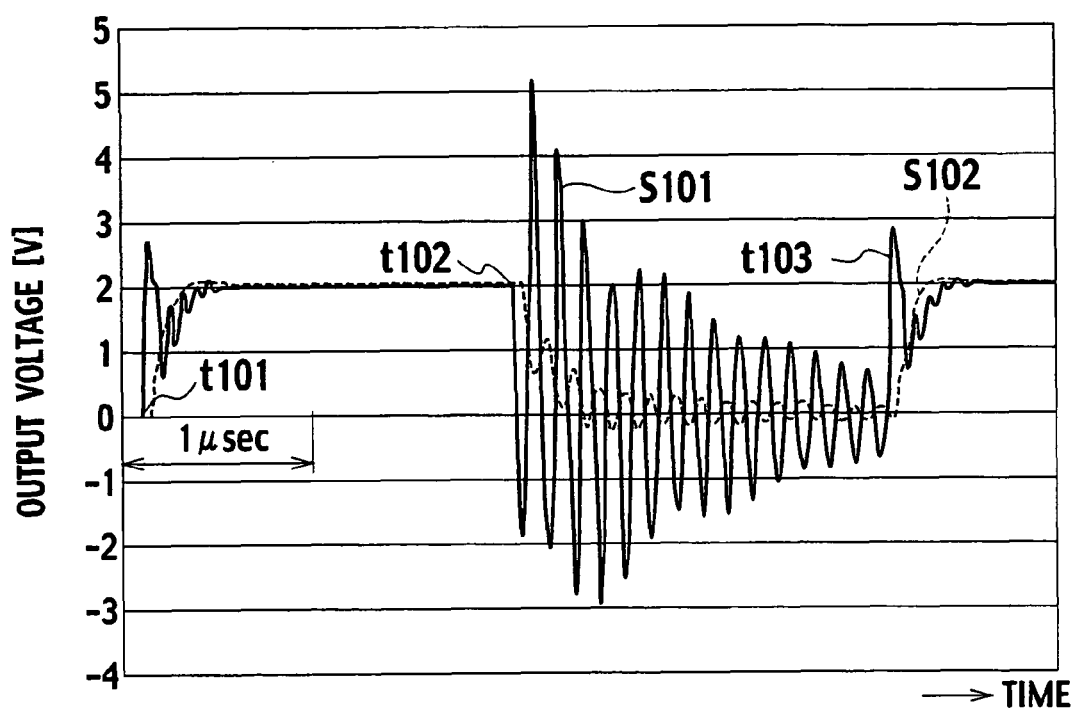
FIG. 2 is a characteristic view showing waveforms of voltages generated at an output terminal of ECU 101 and at J/C 104 shown in FIG. 1.
Figure 3:
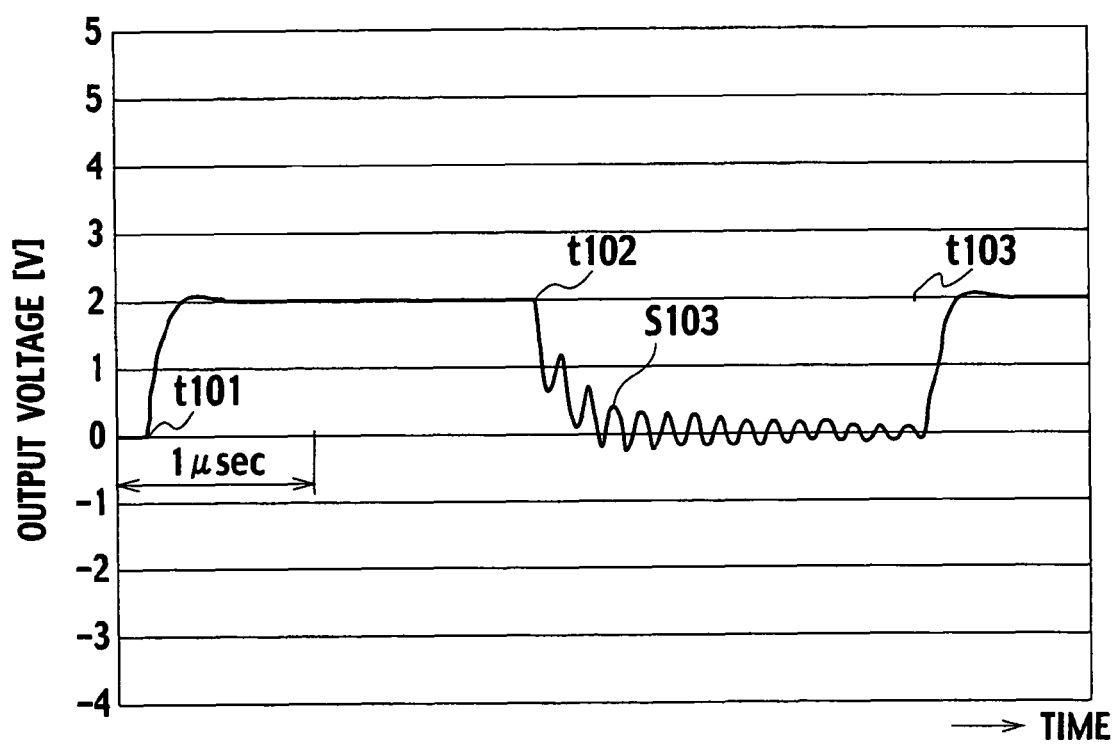
FIG. 3 is a characteristic view showing a waveform of a voltage generated at an input terminal of ECU 102 shown in FIG. 1.

In other words, in comparison with the conventional example shown by the curve S101 in FIG. 2, the amplitude of a signal waveform caused by ringing is reduced rapidly. Further, as shown in the curves S2 to S4 shown in FIGS. 6 to 8, the amplitudes of the signal waveforms at the point P1, the point P2, and the input terminal of the ECU 2 are also reduced rapidly and then the voltages reach almost zero.

Accordingly, the vehicle communication system according to this embodiment can suppress ringing which is generated when the transmission of a signal from the ECU 1 is turned off from an ON state.

This is because, the delay circuit 6 is provided between the points P1 and P2, and in addition, the point P1 is grounded through the termination resistor $R_T1$ and the point P2 is grounded through the termination resistor $R_T2$. Therefore, impedance is generated between the termination resistors $R_T1$ and $R_T2$ (in other words, between the points P1 and P2). As a result, the junction points within J/C 4 does not become "sections" of a standing wave generated in the communication lines 11 and 12 connecting the ECU 1 and the J/C 4.

In the vehicle communication system according to the embodiment, the delay circuit 6 is provided within the J/C 4, one end P1 of the delay circuit 6 is grounded through the termination resistor $R_T1$ and the other end P2 of the delay circuit is grounded through the termination resistor $R_T2$. Therefore, generation of a standing wave between the ECU 1 and the J/C 3 is prevented, thus suppressing ringing effectively.

The J/C 4 has been described so far. As for the J/C 5, generation of ringing is similarly prevented by provision of the delay circuit 7. Therefore, communication errors are reduced dramatically, resulting in a significant improvement in communication accuracy.

Moreover, in the aforementioned embodiment, description is about an example where the J/C 4 is provided with the delay circuit 6 made from an element such as a resistor, a coil, and a capacitor. However, the present invention is not limited to this. An electric wire such as a wire harness may be disposed and used as the delay circuit. In this case, characteristic impedance of the wire harness acts as the delay circuit 6.

The vehicle communication system according to the present invention has been described based upon the illustrated embodiment. However, the present invention is not limited to the embodiment and the constituents in the embodiment can be replaced with arbitrary constituents having the same functions. For example, in the embodiment described above, resistance of the two termination resistors $R_T1$ and $R_T2$ are set at the same value, but the values do not always have to be the same.

What is claimed is:

1. A vehicle communication system, comprising:
    a transmission node for transmitting a signal;
    a plurality of reception nodes for receiving the signal;
    a first communication line having a first end connected to the transmission node and a second end connected to a branching means for branching the first communication line into a plurality of second communication lines, the second communication lines connected to the plurality of reception nodes;
    a delay circuit having a first end connected to the second end of the first communication line and a second end connected to the second communication lines;
    a first termination resistor connecting the first end of the delay circuit to ground; and
    a second termination resistor connecting the second end of the delay circuit to ground,
    wherein an impedance that mitigates oscillations in the signal received by the plurality of reception nodes caused by a transition in the signal transmitted by the transmission node is generated between the first termination resistor and the second termination resistor.

2. The vehicle communication system according to claim 1, wherein values of resistance of the first and second termination resistors are the same.

3. The vehicle communication system according to claim 1, wherein the delay circuit includes at least one of a resistor, a coil, or a capacitor.

4. The vehicle communication system according to claim 1, wherein the delay circuit is an electric wire having a predetermined length.

5. The vehicle communication system according to claim 1, wherein:
    the first communication line has a first length,
    the second communication lines have second lengths that are less than the first lengths, and
    the delay circuit is configured to exhibit an impedance of a communication line having a third length, the third length being less than at least one of the first lengths and the second lengths.

* * * * *